(12) United States Patent
Chang

(10) Patent No.: US 8,717,075 B2
(45) Date of Patent: May 6, 2014

(54) PHASE LOCKED LOOP CIRCUIT

(71) Applicants: Global Unichip Corp., Hsinchu (TW); Taiwan Semiconductor Manufacturing Co., Ltd., Hsin-Chu (TW)

(72) Inventor: Chun-Chi Chang, New Taipei (TW)

(73) Assignees: Global Unichip Corp., Hsinchu (TW); Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/867,575

(22) Filed: Apr. 22, 2013

(65) Prior Publication Data
US 2013/0285723 A1 Oct. 31, 2013

(30) Foreign Application Priority Data
Apr. 26, 2012 (TW) .............................. 101114857 A

(51) Int. Cl.
*H03L 7/06* (2006.01)

(52) U.S. Cl.
USPC ............ 327/157; 327/148; 327/156; 331/1 A; 331/15; 331/17; 375/374; 375/376

(58) Field of Classification Search
USPC ................. 327/147, 148, 150, 156, 157, 159; 331/1 A, 15–17, 185, 186; 375/374, 375/376
See application file for complete search history.

(56) References Cited

U.S. PATENT DOCUMENTS

| 5,208,555 A * | 5/1993 | Graham et al. ............... 331/1 A |
| 6,411,144 B1 * | 6/2002 | Matsuno ....................... 327/157 |
| 7,123,065 B1 * | 10/2006 | Moyal .......................... 327/156 |

* cited by examiner

*Primary Examiner* — Patrick O'Neill
(74) *Attorney, Agent, or Firm* — McClure, Qualey & Rodack, LLP

(57) ABSTRACT

A phase locked loop circuit includes a phase frequency detector, a control circuit, a charge pump, a loop filter, a supply circuit, a ring oscillator, a frequency divider and a voltage detector. The phase frequency detector generates a frequency-increasing signal and a frequency-decreasing signal according to a phase difference between an input signal and a feedback signal. The control circuit generates a first control signal and/or a second control signal according to the frequency-increasing signal and the frequency-decreasing signal. The charge pump generates a current signal according to the first control signal and/or the second control signal. The voltage detector monitors a supply voltage of the supply circuit, and controls the control circuit to generate only the second control signal so as to reduce the supply voltage if the supply voltage is greater than a high reference voltage.

10 Claims, 6 Drawing Sheets

US 8,717,075 B2

PHASE LOCKED LOOP CIRCUIT

CROSS REFERENCE TO RELATED APPLICATIONS

This Application claims priority of Taiwan Patent Application No. 101114857 filed on Apr. 26, 2012, the entirety of which is incorporated by reference herein.

BACKGROUND OF THE INVENTION

1. Field of the Invention

The disclosure generally relates to a PLL (Phase Locked Loop) circuit, and more particularly, relates to a PLL circuit for avoiding the situation where a supply voltage of a VCO (Voltage-Controlled Oscillator) exceeds a predetermined value.

2. Description of the Related Art

A PLL circuit uses an oscillator having low frequency variation as reference. A variable-frequency component is driven by a feedback of a closed-loop control system to have the same fast and stable phase as that of the oscillator, i.e., for phase locked. When conducting phase locked, the PLL circuit can serve as a modulation circuit or a demodulation circuit in a communication system.

In a traditional PLL circuit, if a supply voltage of a ring oscillator exceeds a predetermined value, it will have a bad impact on performance of the PLL circuit. To solve the foregoing problem, there is a need to design a new PLL circuit for maintaining the supply voltage of the ring oscillator to within an acceptable range.

BRIEF SUMMARY OF THE INVENTION

In one exemplary embodiment, the disclosure is directed to a phase locked loop circuit, comprising: a phase frequency detector, generating a frequency-increasing signal and a frequency-decreasing signal according to a phase difference between an input signal and a feedback signal; a control circuit, generating a first control signal and/or a second control signal according to the frequency-increasing signal and the frequency-decreasing signal; a charge pump, generating a current signal according to the first control signal and/or the second control signal; a loop filter, generating a filtered signal according to the current signal; a voltage-controlled oscillator, comprising: a supply circuit, providing a supply voltage according to the filtered signal; and a ring oscillator, generating an output signal according to the supply voltage; a frequency divider, generating the feedback signal according to the output signal; and a voltage detector, monitoring the supply voltage, and controlling the control circuit to generate only the second control signal so as to reduce the supply voltage if the supply voltage is greater than a high reference voltage.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
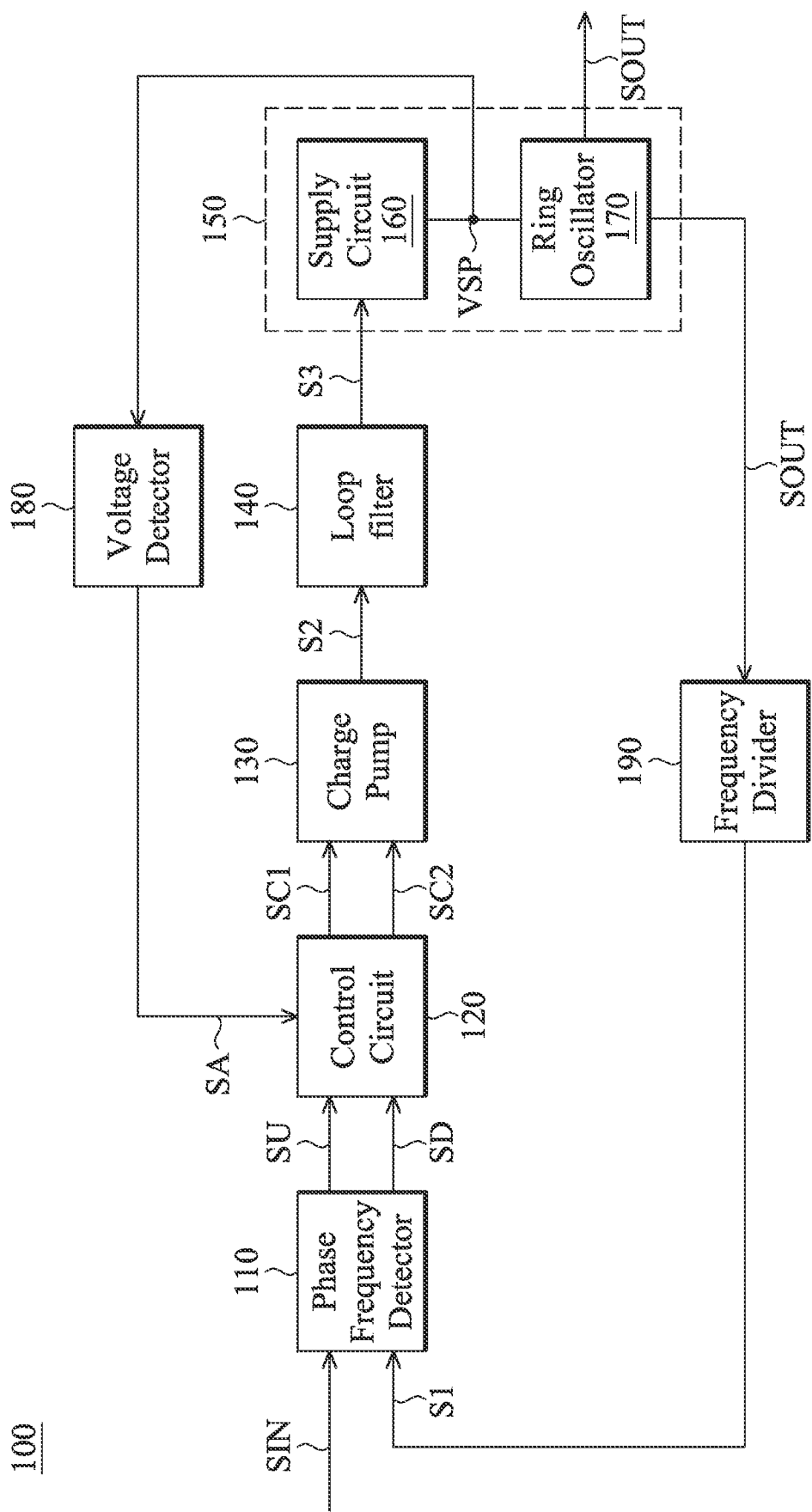
FIG. 1 is a diagram for illustrating a PLL (Phase Locked Loop) circuit according to an embodiment of the invention.

FIG. 1 is a diagram for illustrating a PLL (Phase Locked Loop) circuit 100 according to an embodiment of the invention. As shown in FIG. 1, the PLL circuit 100 comprises a PFD (Phase Frequency Detector) 110, a control circuit 120, a CP (Charge Pump) 130, a loop filter 140, a VCO (Voltage-Controlled Oscillator) 150, a voltage detector 180, and a frequency divider 190. The VCO 150 comprises a supply circuit 160 and a ring oscillator 170. A protection circuit is formed by the control circuit 120 and the voltage detector 180 so as to avoid the situation where a supply voltage VSP of the VCO 150 exceeds a predetermined value.

The PFD 110 detects a phase difference between an input signal SIN and a feedback signal S1, and generates a frequency-increasing signal SU and a frequency-decreasing signal SD according to the phase difference. In some embodiments, the PFD 110 generates the frequency-increasing signal SU and the frequency-decreasing signal SD at the same time, but the frequency-increasing signal SU and the frequency-decreasing signal SD have different durations. The control circuit 120 generates a first control signal SC1 and/or a second control signal SC2 according to the frequency-increasing signal SU and the frequency-decreasing signal SD. In a preferred embodiment, if the control circuit 120 receives an alert signal SA from the voltage detector 180, the control circuit 120 will generate only the second control signal SC2.

The CP 130 generates a current signal S2 according to the first control signal SC1 and/or the second control signal SC2. The loop filter 140 filters the current signal S2 so as to generate a filtered signal S3. The loop filter 140 may be an LPF (Low-Pass Filter). The supply circuit 160 provides the supply voltage VSP according to the filtered signal S3. The ring oscillator 170 generates an output signal SOUT according to the supply voltage VSP. In some embodiments, the ring oscillator 170 comprises a plurality of inverters coupled in series to form a ring, and each inverter is coupled between the supply voltage VSP and a ground voltage GND. The frequency divider 190 generates the feedback signal S1 according to the output signal SOUT, wherein the frequency of the output signal SOUT is N times greater than that of the feedback signal S1 (N is a positive integer).

The voltage detector 180 monitors the supply voltage VSP. If the voltage detector 180 detects that the supply voltage VSP is greater than a high reference voltage VRH, the voltage detector 180 will generate the alert signal SA such that the control circuit 120 generates only the second control signal SC2, thereby reducing the supply voltage VSP. In another embodiment, if the supply voltage VSP is greater than the high reference voltage VRH, the control circuit 120 will prevent the frequency-increasing signal SU from being transmitted to the CP 130, thereby reducing the supply voltage VSP.

Figure 2:
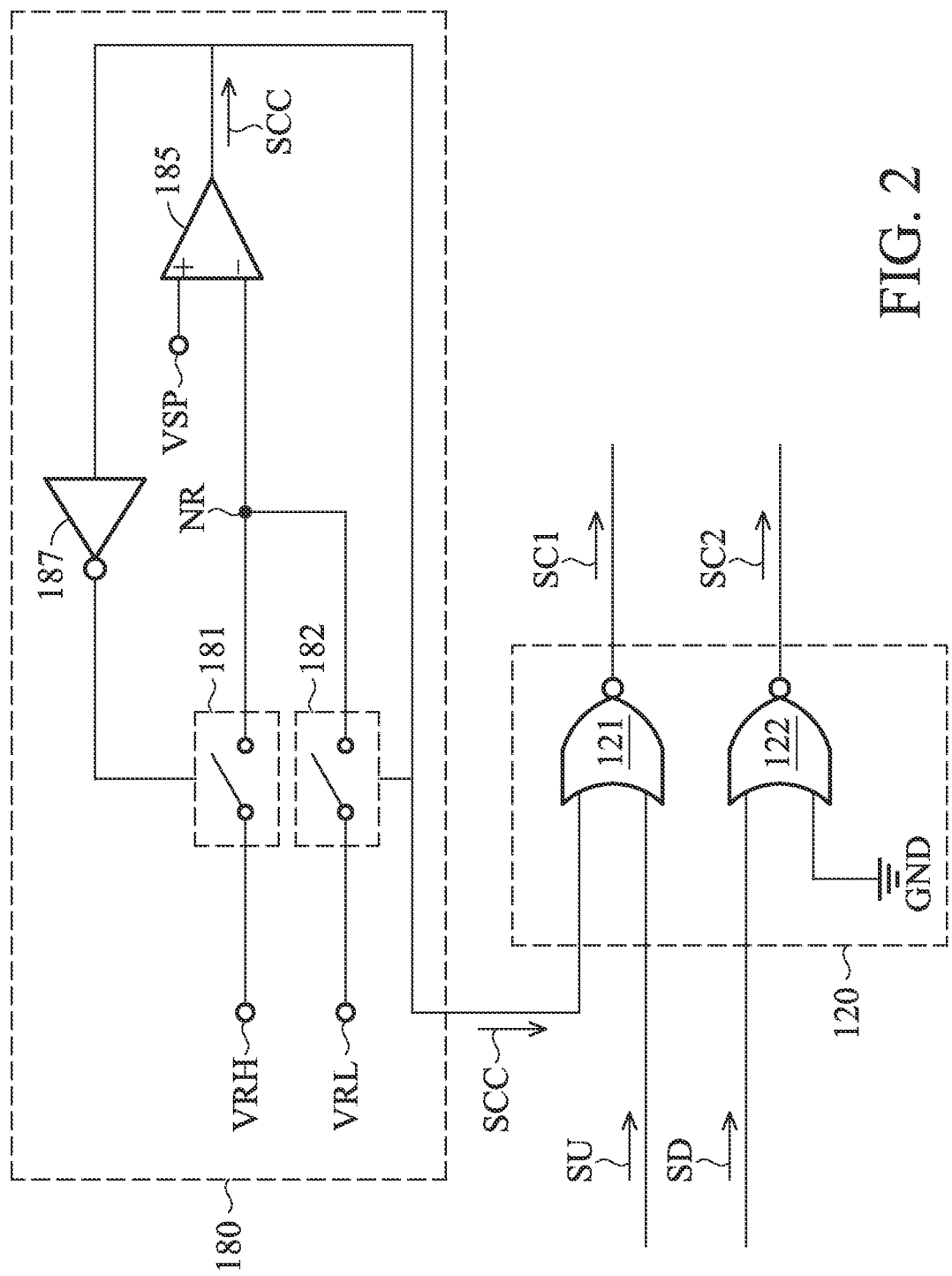
FIG. 2 is a diagram for illustrating a control circuit and a voltage detector according to an embodiment of the invention.

FIG. 2 is a diagram for illustrating the control circuit 120 and the voltage detector 180 according to an embodiment of the invention. As shown in FIG. 2, the voltage detector 180 comprises switches 181 and 182, a comparator 185, and an inverter 187. The comparator 185 has a positive input terminal for receiving the supply voltage VSP, a negative input terminal coupled to a reference node NR, and a comparator output terminal for outputting a comparison signal SCC. In some embodiments, if the voltage at the positive input terminal is greater than that at the negative input terminal, the comparison signal SCC will be equal to a work voltage VDD. If the voltage at the positive input terminal is smaller than that at the negative input terminal, the comparison signal SCC will be equal to the ground voltage GND. The comparison signal SCC may be equivalent to the alert signal SA as shown in FIG. 1.

The inverter 187 inverts the comparison signal SCC. The switch 181 is coupled between the high reference voltage VRH and the reference node NR, and selectively opens and closes according to the inverted comparison signal SCC, i.e., the output of the inverter 187. The switch 182 is couple between a low reference voltage VRL and the reference node NR, and selectively opens and closes according to the comparison signal SCC. For example, if the comparison signal SCC is equal to the work voltage VDD, the switch 181 will open and the switch 182 will close, and if the comparison signal SCC is equal to the ground voltage GND, the switch 181 will close and the switch 182 will open. Each of the switches 181 and 182 may be an NMOS transistor (N-channel Metal-Oxide-Semiconductor Field-Effect Transistor).

The control circuit 120 comprises NOR logic gates 121 and 122. The NOR logic gate 121 generates the first control signal SC1 according to the comparison signal SCC and the frequency-increasing signal SU. The NOR logic gate 122 generates the second control signal SC2 according to the frequency-decreasing signal SD and the ground voltage GND. In a preferred embodiment, if the supply voltage VSP is greater than the high reference voltage VRH, the comparison signal SCC must be equal to logic 1 (or the work voltage VDD), and the frequency-increasing signal SU cannot be transmitted to the CP 130. In other words, since the first control signal SC1 is always equal to the ground voltage GND, the control circuit 120 can generate only the second control signal SC2. Therefore, the output frequency of the VCO 150 will decrease, and the supply voltage VSP will be reduced.

In an embodiment, the work voltage VDD is approximately equal to 1.8V, the ground voltage GND is approximately equal to 0V, the high reference voltage VRH is approximately equal to 0.9V, and the low reference voltage VRL is approximately equal to 0.6V. The foregoing voltages may be adjusted under different circumstances.

Figure 3:
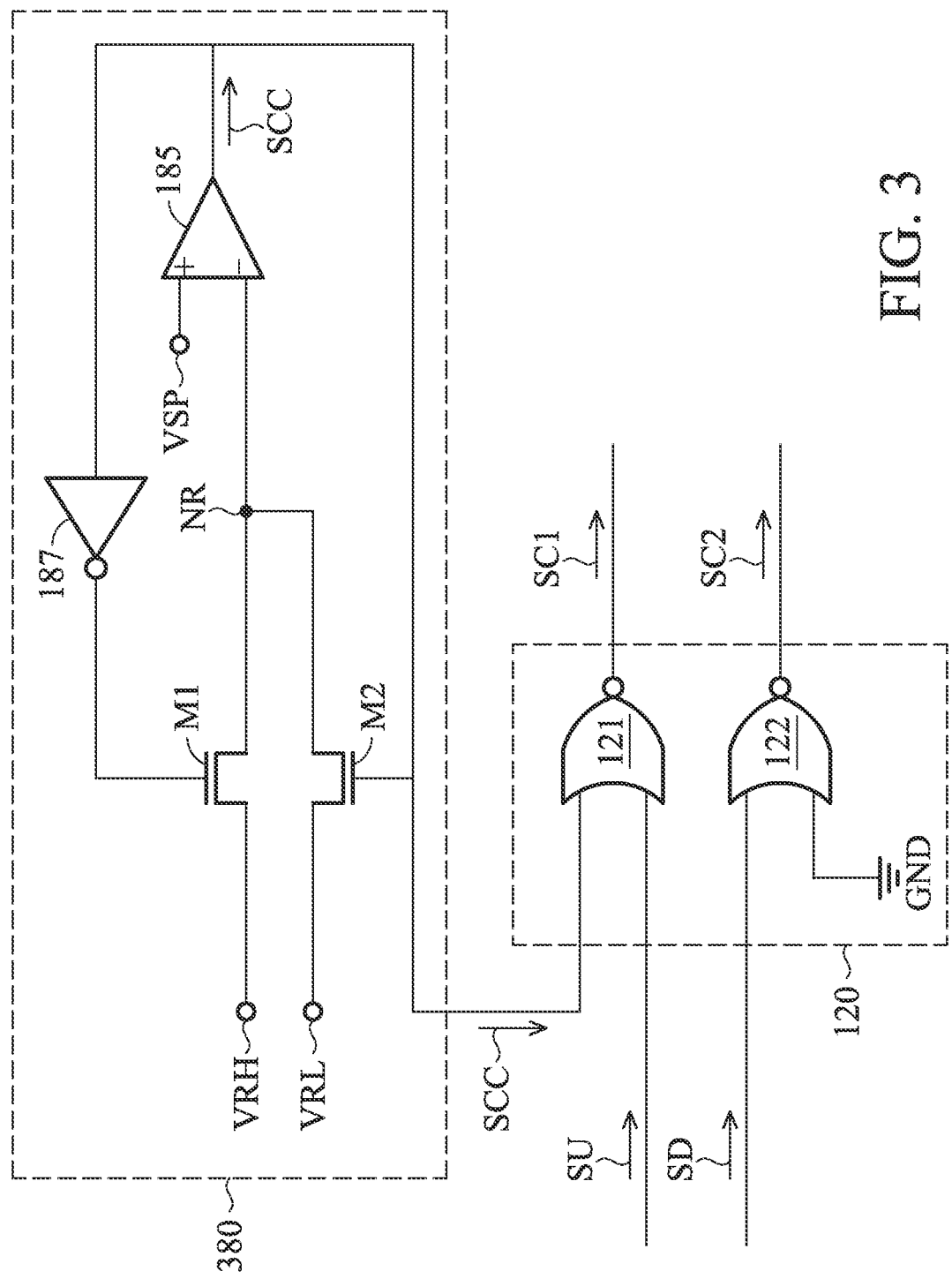
FIG. 3 is a diagram for illustrating a control circuit and a voltage detector according to another embodiment of the invention.

FIG. 3 is a diagram for illustrating the control circuit 120 and a voltage detector 380 according to another embodiment of the invention. The voltage detector 380 in FIG. 3 is similar to the voltage detector 180 in FIG. 2. The difference between them is that the switches 181 and 182 are replaced with NMOS transistors M1 and M2, respectively. The NMOS transistor M1 is coupled between the high reference voltage VRH and the reference node NR, and has a gate for receiving the inverted comparison signal SCC. The NMOS transistor M2 is coupled between the low reference voltage VRL and the reference node NR, and has a gate for receiving the comparison signal SCC.

Figure 4:
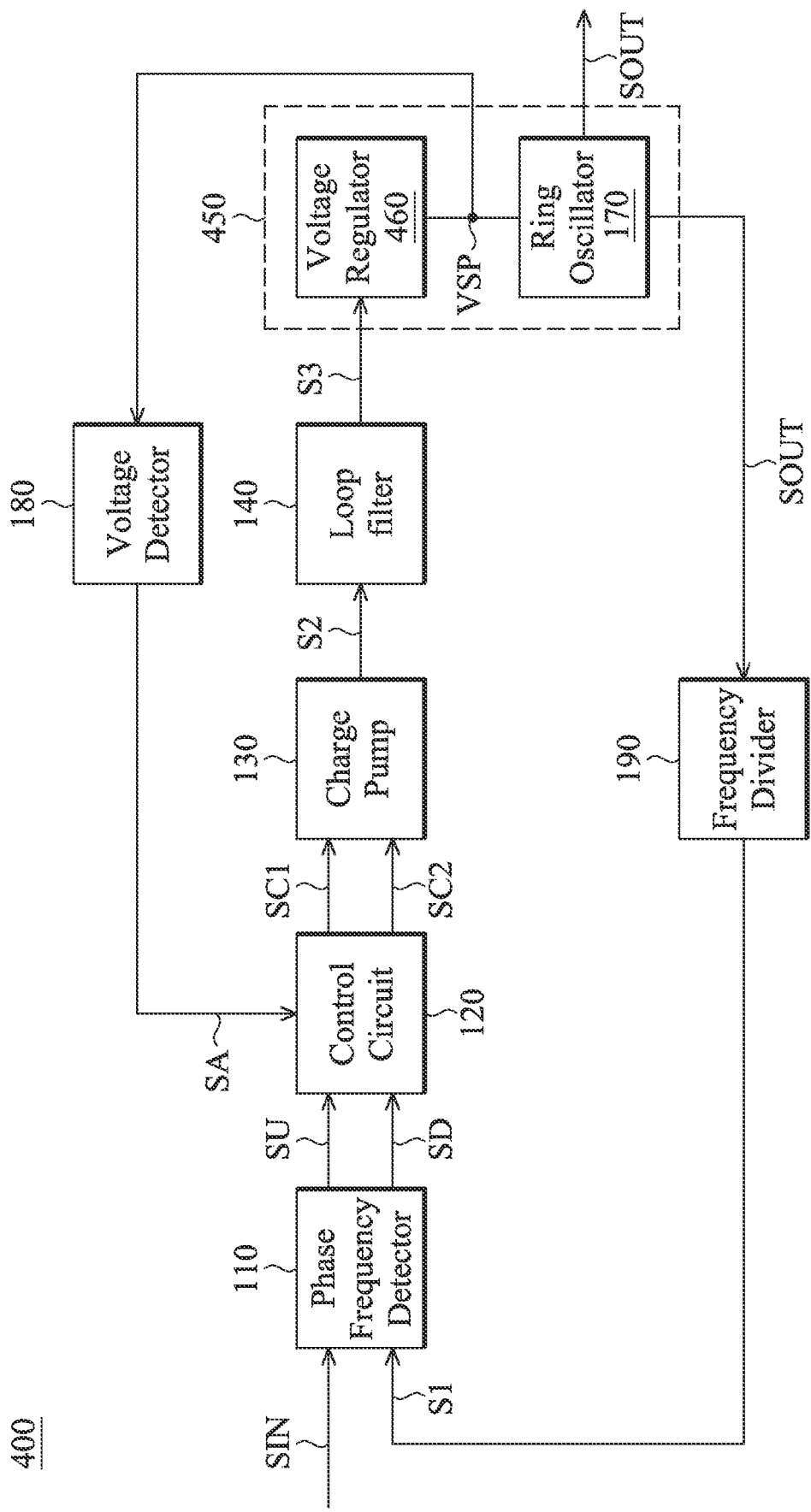
FIG. 4 is a diagram for illustrating a PLL circuit according to another embodiment of the invention.

FIG. 4 is a diagram for illustrating a PLL circuit 400 according to another embodiment of the invention. The PLL circuit 400 in FIG. 4 is similar to the PLL circuit 100 in FIG. 1. The difference between them is that the VCO 150 is replaced with a VCO 450, in which the supply circuit 160 is replaced with a voltage regulator 460. The voltage regulator 460 can provide a stable supply voltage VSP.

Figure 5A:
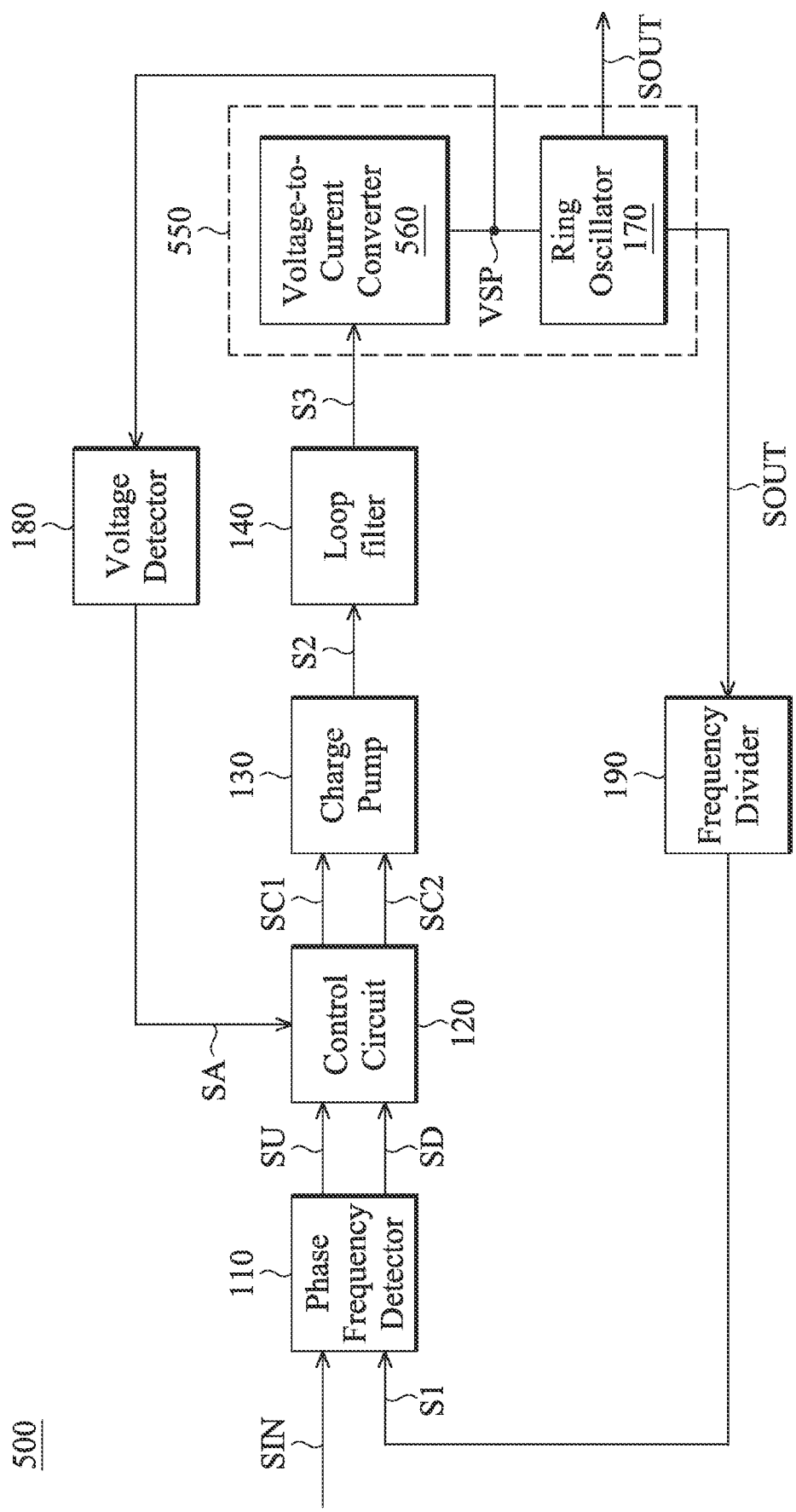
FIG. 5A is a diagram for illustrating a PLL circuit according to another embodiment of the invention.

FIG. 5A is a diagram for illustrating a PLL circuit 500 according to another embodiment of the invention. The PLL circuit 500 in FIG. 5A is similar to the PLL circuit 100 in FIG. 1. The difference between them is that the VCO 150 is replaced with a VCO 550, in which the supply circuit 160 is replaced with a voltage-to-current converter 560. The voltage-to-current converter 560 can convert a voltage signal into a current signal, and may be implemented by a PMOS transistor (P-channel Metal-Oxide-Semiconductor Field-Effect Transistor).

Figure 5B:
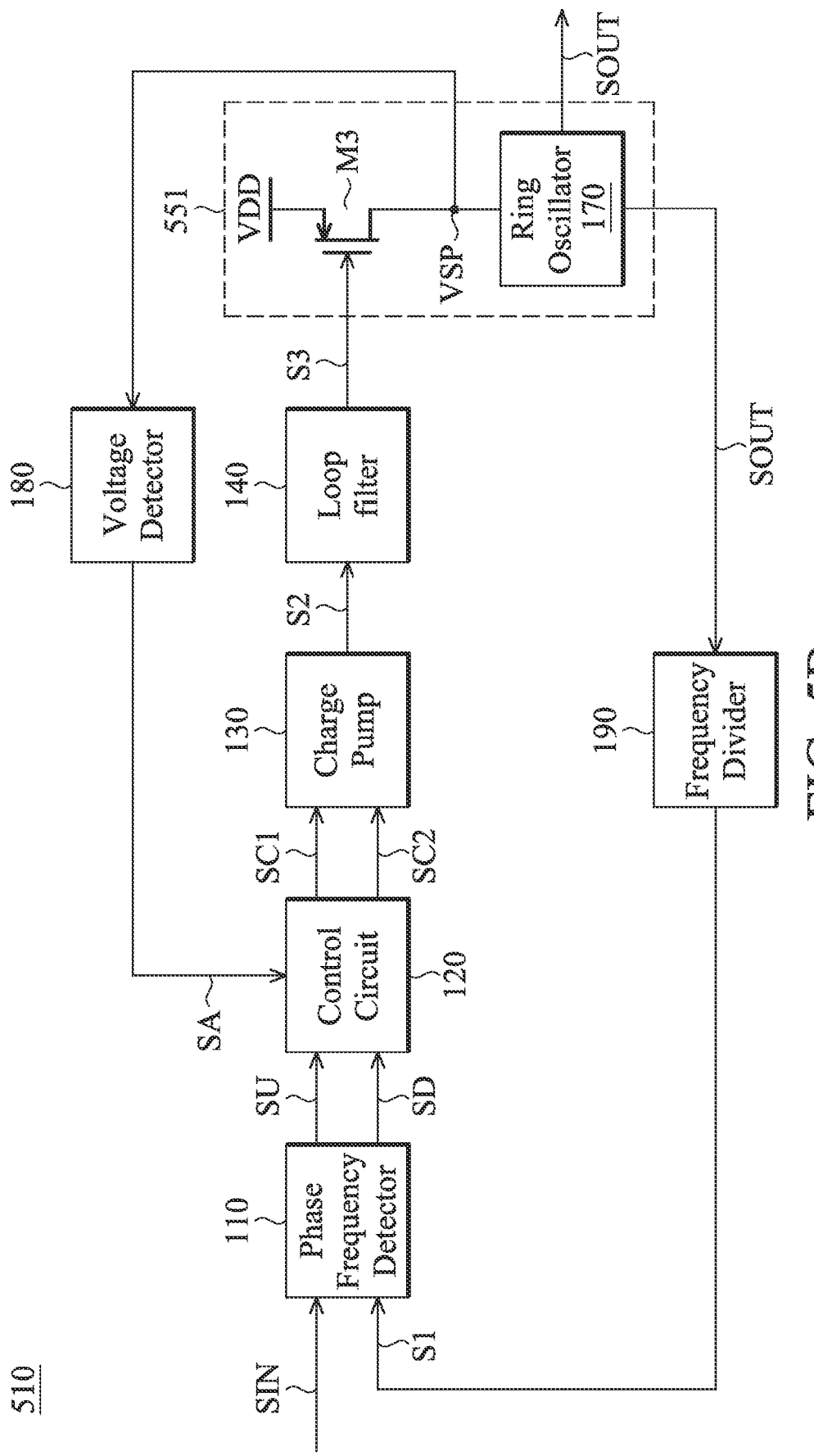
FIG. 5B is a diagram for illustrating a PLL circuit according to another embodiment of the invention.

FIG. 5B is a diagram for illustrating a PLL circuit 510 according to another embodiment of the invention. The PLL circuit 510 in FIG. 5B is similar to the PLL circuit 100 in FIG. 1. The difference between them is that the VCO 150 is replaced with a VCO 551, in which the supply circuit 160 is replaced with a PMOS transistor M3. The PMOS transistor M3 is coupled between the work voltage VDD and the ring oscillator 170, and has a gate for receiving the filtered signal S3.

The PLL circuit of the invention can effectively maintain the supply voltage VSP between the high reference voltage VRH and the low reference voltage VRL, thereby avoiding the situation where excessive supply voltage VSP degrades performance of the PLL circuit. The high reference voltage VRH and the low reference voltage VRL may be set by a user.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

It will be apparent to those skilled in the art that various modifications and variations can be made in the invention. It is intended that the standard and examples be considered as exemplary only, with a true scope of the disclosed embodiments being indicated by the following claims and their equivalents.

What is claimed is:

1. A phase locked loop circuit, comprising:
a phase frequency detector, generating a frequency-increasing signal and a frequency-decreasing signal according to a phase difference between an input signal and a feedback signal;
a control circuit, generating a first control signal and/or a second control signal according to the frequency-increasing signal and the frequency-decreasing signal;
a charge pump, generating a current signal according to the first control signal and/or the second control signal;
a loop filter, generating a filtered signal according to the current signal;
a voltage-controlled oscillator, comprising:
a supply circuit, providing a supply voltage according to the filtered signal; and
a ring oscillator, generating an output signal according to the supply voltage;
a frequency divider, generating the feedback signal according to the output signal; and
a voltage detector, monitoring the supply voltage, and controlling the control circuit to generate only the second control signal so as to reduce the supply voltage if the supply voltage is greater than a high reference voltage.

2. The phase locked loop circuit as claimed in claim 1, wherein the voltage detector comprises:
a comparator, comprising:

a positive input terminal, configured to receive the supply voltage;

a negative input terminal, coupled to a reference node; and a comparator output terminal, configured to output a comparison signal;

an inverter, configured to invert the comparison signal;

a first switch, coupled between the high reference voltage and the reference node, and selectively opening and closing according to the inverted comparison signal; and a second switch, coupled between a low reference voltage and the reference node, and selectively opening and closing according to the comparison signal.

3. The phase locked loop circuit as claimed in claim 2, wherein the control circuit comprises:

a first NOR logic gate, generating the first control signal according to the comparison signal and the frequency-increasing signal; and a second NOR logic gate, generating the second control signal according to the frequency-decreasing signal and a ground voltage.

4. The phase locked loop circuit as claimed in claim 2, wherein the first switch is a first NMOS transistor (N-channel Metal-Oxide-Semiconductor Field-Effect Transistor) which has a gate configured to receive the inverted comparison signal.

5. The phase locked loop circuit as claimed in claim 2, wherein the second switch is a second NMOS transistor (N-channel Metal-Oxide-Semiconductor Field-Effect Transistor) which has a gate configured to receive the comparison signal.

6. The phase locked loop circuit as claimed in claim 2, wherein the high reference voltage is approximately equal to 0.9V.

7. The phase locked loop circuit as claimed in claim 2, wherein the low reference voltage is approximately equal to 0.6V.

8. The phase locked loop circuit as claimed in claim 1, wherein the supply circuit is a voltage regulator.

9. The phase locked loop circuit as claimed in claim 1, wherein the supply circuit is a voltage-to-current converter.

10. The phase locked loop circuit as claimed in claim 9, wherein the voltage-to-current converter is a PMOS transistor (P-channel Metal-Oxide-Semiconductor Field-Effect Transistor) which is coupled between a work voltage and the ring oscillator and has a gate configured to receive the filtered signal.

* * * * *